United States Patent [19]
Zettler

[11] Patent Number: 5,824,233
[45] Date of Patent: Oct. 20, 1998

[54] MICROMECHANICAL COMPONENT WITH A DIELECTRIC MOVABLE STRUCTURE, MICROSYSTEM, AND PRODUCTION PROCESS

[75] Inventor: Thomas Zettler, München, Germany

[73] Assignee: Siemens Aktiengesellschaft, Munich, Germany

[21] Appl. No.: 756,348

[22] Filed: Nov. 26, 1996

Related U.S. Application Data

[62] Division of Ser. No. 431,492, Apr. 28, 1995, Pat. No. 5,602,411.

[30] Foreign Application Priority Data

Apr. 28, 1994 [DE] Germany .......................... 44 14 969.7

[51] Int. Cl.⁶ ............................. H01L 21/306; H01G 7/00
[52] U.S. Cl. ................................ 216/2; 438/53; 257/417; 73/514.32
[58] Field of Search .................................. 216/2; 438/53; 257/417; 73/514.32

[56] References Cited

U.S. PATENT DOCUMENTS

| | | | |
|---|---|---|---|
| 4,530,029 | 7/1985 | Beristain | 361/283 |
| 4,901,586 | 2/1990 | Blake et al. | 73/862.59 |
| 5,332,469 | 7/1994 | Mastrangelo | 156/643 |

*Primary Examiner*—R. Bruce Breneman
*Assistant Examiner*—Michael E. Adjodha
*Attorney, Agent, or Firm*—Herbert L. Lerner; Laurence A. Greenberg

[57] ABSTRACT

A micromechanical component includes a fixed micromechanical structure having a pair of capacitor plates being formed of one or more conductive layers, and a movable micromechanical structure being formed of a dielectric layer to be introduced into or removed from an interstice between the plates. A capacitance change is obtained through the resilient or freely movable dielectric, so that the component can be inserted as a proportional or a non-proportional force sensor. A microsystem with an integrated circuit and a micromechanical component with a movable dielectric, as well as a production method for the component and the microsystem, are also provided.

6 Claims, 2 Drawing Sheets

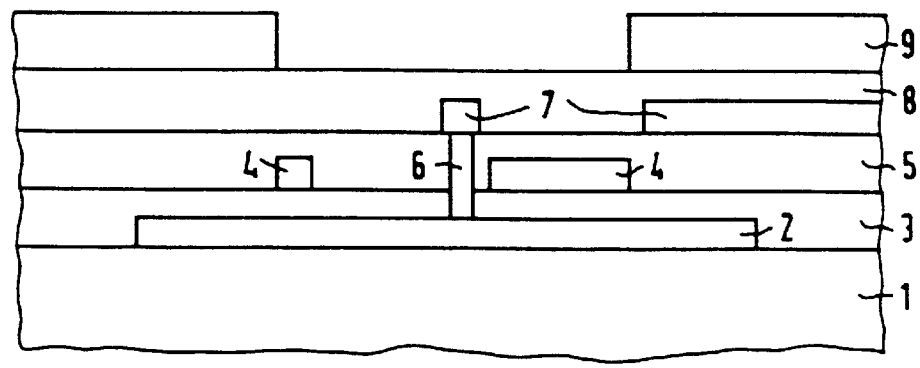
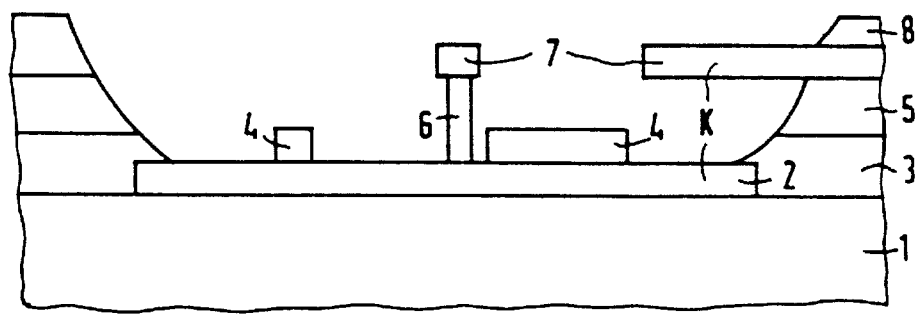
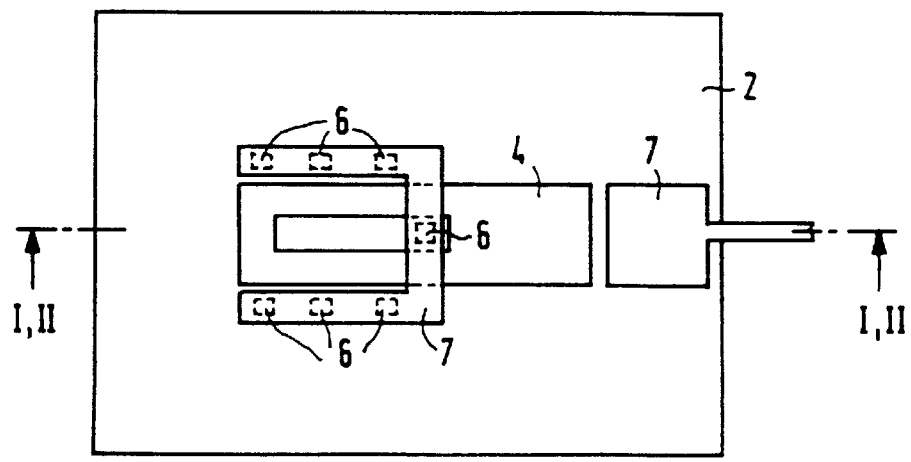

MICROMECHANICAL COMPONENT WITH A DIELECTRIC MOVABLE STRUCTURE, MICROSYSTEM, AND PRODUCTION PROCESS

This is a division of application Ser. No. 08/431,492 filed on Apr. 28, 1995, now U.S. Pat. No. 5,602,411.

BACKGROUND OF THE INVENTION

Field of the Invention

The invention relates to a micromechanical component having a fixed micromechanical structure with a pair of capacitor plates and a movable micromechanical structure. The invention also relates to a microsystem on a semiconductor substrate with an integrated circuit and a micromechanical component. The invention additionally relates to a production process.

Micromechanical components are used for various purposes; one important field of application is that of proportional and non-proportional force sensors (acceleration and inclination sensors). The known sensors of that kind have fixed and movable micromechanical structures and are based on the capacitive measurement of the variation of the electrode spacing of a micromechanical capacitor. For instance, in the article by Sherman et al. in Conf. Proc. IEDM 92, page 501 (No. 0-7803-0817-4/92 IEEE), a structure is proposed in which a movable suspended polysilicon tongue is located between two fixedly mounted tongues. An acceleration changes the spacing of the movable tongue relative to the fixed tongues, causing the capacitance to one of the fixed tongues to increase and the capacitance to the other to decrease. That change is detected electrically.

In the production of such micromechanical components, there is great interest in processes that are compatible with the manufacture of integrated circuits, especially on a silicon substrate. Integrating micromechanics and trigger or evaluation circuits in Microsystems is possible only if there is compatibility of the production processes. That is also important whenever existing semiconductor production systems are to be used to produce micromechanical structures as well. A process with which both an integrated circuit and a micromechanical component can be produced simultaneously in different regions of the semiconductor substrate, or in other words with which a microsystem can be produced with only minimal additional effort, besides that for the integrated circuit, would be especially advantageous.

For micromechanical components, the following production processes are known, among others:

a) Polysilicon Center Pin and Flange Process (M. Mehrengany, Y.C. Tai, J. Micromech. Microeng., Vol. 1, 73, 1991):

In order to produce the micromechanical structures following the production of the integrated circuit, such a process requires additional depositions of polysilicon after the metallizing complex. If the center pin process is to be performed before the integrated circuit is metallized, then the problem arises of etching the movable structures until they are exposed, i.e., laid bare, and simultaneously of protecting the insulation of the metallizing. Another disadvantage is the relatively high specific resistance of doped polysilicon.

b) Polysilicon-LOCOS Process (L. S. Tavrow et al, Sensors and Actuators A, Phys., Vol. A35, 33, 1992):

That process provides for making the movable micromechanical structures on a flat LOCOS oxide layer. Due to the temperature stress, the oxidation step can be performed only prior to the production of the transistors of an integrated circuit. If the entire process is carried out before the integrated circuit is produced, the resultant topology is unfavorable for the later steps, and the problem arises of protecting the micromechanical structures during the production of the integrated circuit. In an intertwined production process of that kind, the problem of etching the rotor in such a way that it is freely exposed while simultaneously protecting the circuit insulation oxides must be solved.

c) Selective Tungsten Process (L. Y. Chen et al, TRANSDUCERS '91, Int. Conf. on Solid-State Sensors and Actuators, San Francisco, Calif., IEEE Cat. No. 91CH2817-5, 739, 1991):

That process can be carried out following a circuit production process, but the proposed method does not solve the problems of electrical contacting and. of protecting the metallizing insulation. The process is especially complicated and quite expensive because of the lithography steps.

d) LIGA Process (P. Bley et al, Microelectronic Engineering 13, 509, 1991; H. Guckel et al, Conf. Proceedings IEEE Micro Electro Mechanical Systems, Nara, Japan, 1991):

That process requires X-ray lithography and possibly later mounting of loose microscopic components.

None of those processes are configured in terms of their conception for the joint and in particular simultaneous production of an integrated circuit and the micromechanical component in a microsystem. They require a great number of layers and process steps, which serve solely to produce the micromechanical component, and are superfluous or even constricting or disadvantageous for the production of an integrated circuit.

SUMMARY OF THE INVENTION

It is accordingly an object of the invention to provide a micromechanical component with a dielectric movable structure, a microsystem, and a production process, which overcome the hereinafore-mentioned disadvantages of the heretofore-known products and processes of this general type, which can be used as a proportional or non-proportional force sensor and in which only minimal additional process effort and expense are needed to make the micromechanical component, beginning with the IC production.

With the foregoing and other objects in view there is provided, in accordance with the invention, a claims micromechanical component, comprising a fixed micromechanical structure having a pair of capacitor plates being formed of at least one conductive layer and being spaced apart defining an interstice therebetween; and a movable micromechanical structure being formed of a dielectric layer to be introduced into and removed from the interstice between the plates.

With the objects of the invention in view, there is also provided a production process for a micromechanical component, which comprises forming fixed and movable micromechanical structures being separated from one another by an intervening insulating layer; and removing the insulating layer around the movable micromechanical structure and at least partly within the interstice between the plates with an etching process being selective for the fixed and movable micromechanical structures and having an isotropic component.

With the objects of the invention in view, there is additionally provided a microsystem on a semiconductor substrate, comprising a micromechanical component including a fixed micromechanical structure having a pair of capacitor plates being formed from at least one conductive layer and being spaced apart defining an interstice therebetween, and a movable micromechanical structure being formed from a dielectric layer and being movable in the interstice between the plates; and an integrated circuit including circuit elements being wired with the aid of at least one of the at least one conductive layer.

With the objects of the invention in view, there is concomitantly provided a production process for a microsystem, which comprises producing the fixed micromechanical structure by structuring the at least one conductive layer, while simultaneously structuring the at least one conductive layer in the region of the integrated circuit; and exposing at least a portion of the interstice between the plates and the movable micromechanical structure by removal of the insulating layer in an etching process having adequate selectivity for the at least one conductive layer and the dielectric layer and having an isotropic component.

The invention is based on the use of a dielectric movable structure which is inserted by the force to be measured between a pair of capacitor plates, as a fixed micromechanical structure, causing the capacitance thereof to change. The change in capacitance is measured. Conversely, the force can also cause the removal of the dielectric from the interstice. The dielectric structure can be freely or resiliently movable, so that the component acts as a non-proportional or as a proportional force sensor. The component principle can also be employed for actors since the field of a charged capacitor exerts a force on the dielectric. In each case, a material with a high dielectric constant $\epsilon_r$ is advantageous, with an example being silicon nitride.

In the production process of the invention, the pair of capacitor plates is structured from the same or different conductive layers, and the movable structure is structured from a dielectric layer. The fixed and the movable structures are separated from one another by an insulating layer. A mask is then applied and an etching process with an isotropic component is carried out, which removes the insulating layer selectively down to the fixed structure, at least around the dielectric. After the etching process, the dielectric is freely or resiliently movable. In the case of a freely movable micromechanical structure, after the etching process, this structure no longer has any connection with the remainder of the component. In the case of a resiliently movable micromechanical structure, some connection still exists, preferably through a portion of the dielectric layer extending outward to the side and having a small cross-sectional area. That layer is connected on its other side to a securing plate, for instance, and acts as a spring element between the movable structure and the securing plate.

A proportional or non-proportional force sensor or a motor with a dielectric rotor can be made according to the process. In the first case, conductive layers that are stacked one above the other are preferably used for the pair of capacitor plates, so that this pair is substantially disposed parallel to the substrate surface. Located between the conductive layers are a lower insulating layer, the dielectric layer, and an upper insulating layer. In the latter case, one or more pairs of capacitor plates are structured preferably from the same conductive layer. The insulating and dielectric layers are applied and the dielectric layer is structured to make a structure (that after the etching process) is freely movable in the interstice between plates. The dielectric structure can also be made before the capacitor plates. A non-proportional sensor can be made with both concepts, as needed.

The invention also encompasses a microsystem with an integrated circuit (IC) and a micromechanical component, in which a movable micromechanical structure is formed of a dielectric. In the microsystem according to the invention, one or more conductive layers, which are already needed for wiring the integrated circuit, are used as parts of the micromechanical component. This layer or these layers need merely be structured according to a suitable layout so that in the region of the micromechanical component, a pair of capacitor plates is formed as a fixed micromechanical structure. The production of the dielectric structure is performed, among other ways, in a process step that is additional to the IC production. The isotropic etching process is already needed in the IC production for exposing the connection pads by etching. The integrated circuit may have a single-layer or multilayer wiring (that is, one or more metallizing layers), of which one, several or all can be used for the micromechanical component. The integrated circuit can also be made with any arbitrary technology, such as CMOS.

Other features which are considered as characteristic for the invention are set forth in the appended claims.

Although the invention is illustrated and described herein as embodied in a micromechanical component with a dielectric movable structure, a microsystem, and a production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 and 2 are fragmentary, diagrammatic, cross-sectional views of a semiconductor substrate, which are taken along respective section lines I—I and II—II of FIG. 3, in the direction of the arrows, in a region of a micromechanical component, in terms of which the process is illustrated;

FIG. 3 is a plan view of the micromechanical component of FIG. 1; and

DESCRIPTION OF THE REFERRED EMBODIMENTS

Figure 4:
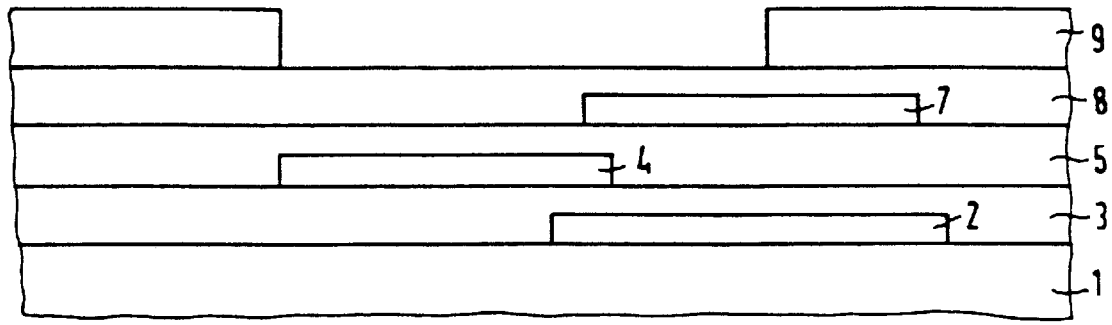
FIGS. 4 and 5 are fragmentary, cross-sectional views

Referring now to the figures of the drawing in detail and first, particularly, to FIGS. 1–3 thereof, there is seen a first exemplary embodiment of a micromechanical component that can be used as a non-proportional force sensor. The component has a pair of capacitor plates that are disposed substantially parallel (horizontal) to a substrate surface and are formed of conductive layers 2 and 7 as a fixed micromechanical component, and it also has a substantially horizontally movable dielectric 4 as its freely movable micromechanical component. The dielectric is preferably annular and is provided with a device for securing it from falling out, which can be formed by the upper conductive layer.

In FIG. 1, a substrate 1 with an arbitrary surface (such as silicon or a field oxide) is shown. The lower conductive layer 2, such as a polysilicon layer or a first metallizing layer, is applied to the substrate and structured. The lower conductive layer 2 is covered with a lower insulating layer 3, and a dielectric layer 4 is applied thereto and structured to make the movable structure. An upper insulating layer 5 is applied and is optionally provided with contact holes, which are then filled with a suitable material to make contacts 6. In a component region BT, these contacts act to provide (mechanical) security, so that their electrical resistance is not important in this case. The upper conductive layer 7 is applied over the upper insulating layer 5 and is structured in such a way that in a predetermined region it forms a pair of capacitor plates with the lower conductive layer 2, or in other words it partly overlaps the layer 2. The dielectric 4 is structured in such a way that (after the isotropic etching process) it can be inserted into an interstice between the capacitor plates or removed therefrom. A device for securing the movable structures that are later to be exposed, in order to prevent them from falling out, can also be formed from the layer 7, for instance by forming a closed hoop with the aid of the underlying layers as is seen FIG. 3, or by forming a surface on the contact 6 that has a larger diameter than the corresponding inside diameter of the annular dielectric 4. The upper conductive layer is covered with a further insulation 8 (passivation layer).

A mask 9 is applied, which has an opening in the region BT above the movable structure 4 to be exposed. Then the insulating layers 3, 5, 8 are etched. In this operation, the following conditions must be taken into account:

the etching process must be sufficiently selective for the dielectric 4, for the conductive layers 2, 7, and in this example for the contact 6 as well; and the isotropic component of the etching process and the size of the opening in the mask must be chosen while taking the individual layer thicknesses into account, in such a way that the dielectric 4 will be entirely underetched. The interstice between plates must also be exposed widely enough by etching.

The etching process is preferably carried out in the form of wet etching, with a buffered HF solution, or in the form of microwave-supported dry etching.

The processes and materials known from IC production (for instance, silicon oxide as the insulating layer and aluminum alloys as the conductive layer) can be employed for the individual steps of the production process. For instance, the production of the metal layer can also be performed simultaneously with the filling up of the contacts, in such a way that after the contact holes have been etched, an adhesive layer (for instance 40 nm Ti+100 nm TiN) is deposited into the corresponding insulation layer, and then in a CVD process, tungsten is applied both to fill the contact holes and simultaneously to act as metallizing layers.

The component can be integrated into a microsystem, and the production of the IC (for instance, a trigger or evaluation circuit made by CMOS technology) takes place simultaneously with the process described. The following points are advantageously taken into account:

On the substrate 1, further method steps which are necessary to make the integrated circuit are performed, such as the production of epitaxial layers, doped wells, channel implantation, and gate oxide. The further conductive layer 2 can be used for the gate layer of the IC. The layer 3 may, for instance, be used for the gate insulation (intermediate oxide). An implantation of the source/drain zones is carried out, among other operations.

With the aid of the contacts 6, an electrical contact 6 between the metallizing layer 7 and the gate layer 2 is made in the IC region.

In the IC region, the contacts 6 and the first metallizing layer also act, for instance, to connect S/D zones of transistors.

Planar layers are preferably used, in situ or by suitable processes, as the insulating layers. Planar layers are also advantageous in the region BT.

The further insulation 8 is formed of a passivation layer of silicon oxide and silicon nitride. The applied mask 9, which has an opening in the region BT above the movable structure to be exposed, has openings in the IC region above the pads to be connected from outside. In the IC region, the isotropic etching must stop at these connection pads.

Details of this kind of exemplary CMOS circuit are shown in FIGS. 1 and 2 (with a two-layer metallization) of co-pending U.S. application Ser. No. (Attorney's Docket No. GR 94 P 1271), filed Apr. 28, 1995, entitled "Microsystem with Integrated Circuit and Micromechanical Component, and Production Process", which is expressly incorporated by reference herein.

The microsystem can be used universally as a non-proportional force sensor (event sensor). Thus the capacitively detected change in position of the ring can also be brought about by the force of flowing media or by direct mechanical action, for instance.

Figure 5:
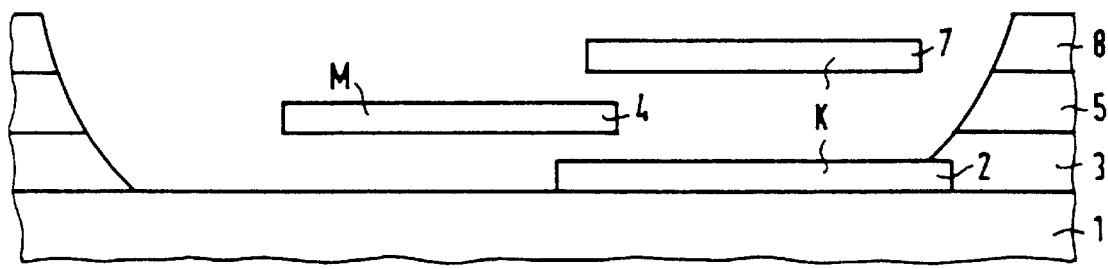
Figure 6:
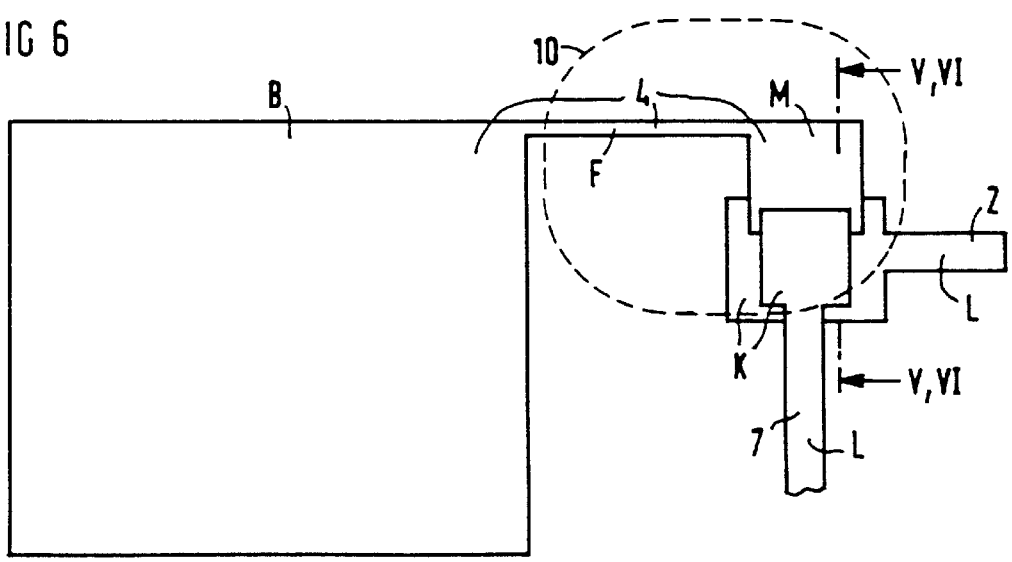
FIG. 6 is a plan view, of a micromechanical component according to a further embodiment of the invention.

As a second example, a micromechanical component that is shown in FIGS. 4–6 and can be used as a proportional force sensor, is described. The second example includes:

a pair of capacitor plates K, being formed of an upper and a lower conductive layer, a ground element M, which is formed of a dielectric layer 4, is suspended resiliently, and can be inserted variously far into the interstice between the plates, a spring element F, which is connected on one side to the ground element and on the other to a securing plate, and a securing plate B, which is connected to the substrate and the spring element.

Preferably, the ground, the spring and the securing plate are formed from the same layer. However, for certain applications it may also be advantageous to make the spring element and the securing plate, for instance, from conductive layers.

The securing plate and the capacitor plates represent fixed micromechanical structures, and the ground element and the spring element (over at least a sufficient portion thereof) represent movable micromechanical structures. The securing plate takes on the task of mechanically connecting the spring element to the substrate. The securing plate B can also be omitted, if it is assured that over a sufficiently large portion the spring will not be underetched. The capacitor plates K can be connected to an evaluation circuit through lines L.

The component can be made with the method described in the first example. The masks need merely be adapted for structuring the dielectric layer 4 and for the isotropic etching process with the mask 9. The reference numerals for the various layers correspond to those of FIGS. 1–3. Since the movable element is not freely movable, the device for securing it against falling out is not provided, and (in the region of the component), no contact 6 is present.

The photoresist mask 9 for the isotropic etching process has a large enough opening to ensure that, as already explained, at least the ground element M and a sufficient amount of the spring element F for the spring action are underetched (FIG. 6). A large enough interstice must also be exposed by etching between the capacitor plates 2, 7. The securing plate B is preferably not exposed by etching, or underetched, so as to assure a secure mechanical fastening to the substrate 1 through the insulating layer 3. In FIG. 6, a region 10 exposed by etching is shown in dashed lines. The insulating layers are not shown.

The capacitor plates can also be formed, essentially side by side, from the same conductive layer or wiring layers, and the ground element M and the spring element F can be formed between the plates in such a way that the ground is movable essentially at right angles to the substrate surface.

Like the first exemplary embodiment, this component can be integrated into a microsystem. In multilayer wiring, the capacitor plates can be formed of the wiring layers. The lines L may be made from a higher wiring layer than the remaining structures.

If a force is exerted upon the ground element, then the spring F bends, and the ground element changes it location. The change in location can be demonstrated as a change in capacitance (a change in $\epsilon_r$) between the capacitor plates. Due to the restoring force of the spring, the capacitance signal varies monotonally with the incident force. The component can therefore be used as an acceleration sensor, by utilizing the force of inertia on the ground element. However, it is equally possible to detect other exertions of force on the ground element. For instance, the force of a flowing liquid or gas, or the direct exertion of force by an external mechanical component, can be detected.

The component can also be used as an actuator, by applying a voltage between the capacitor plates. The electrical field exerts a force on the ground element and causes a displacement. An alternating voltage, in particular, can be applied to the capacitor plates, thus exciting the dielectric ground element to oscillate (oscillator function). Since the mechanical oscillation amplitudes become maximal when excited with the natural frequency of the spring/ground system, the component can be used as a frequency-determining element (resonator) in an electronic circuit.

I claim:

1. A production process for a micromechanical component, which comprises:

forming fixed and movable micromechanical structures being separated from one another by an intervening insulating layer, the fixed micromechanical structure having a pair of capacitor plates being formed of at least one conductive layer and being spaced apart defining an interstice therebetween, and the movable micromechanical structure being formed of a dielectric layer to be introduced into and removed from the interstice between the plates; and removing the insulating layer around the movable micromechanical structure and at least partly within the interstice between the plates with an etching process being selective for the fixed and movable micromechanical structures and having an isotropic component.

2. The production process according to claim 1, which comprises forming the capacitor plates from two conductive layers being stacked one above the other, and forming a lower insulating layer, the movable dielectric structure and an upper insulating layer between the two conductive layers.

3. A production process for a microsystem including a micromechanical component having a fixed micromechanical structure with a pair of capacitor, plates being formed from at least one conductive layer and being spaced apart defining an interstice therebetween, a movable micromechanical structure being formed from a dielectric layer and being movable in the interstice between the plates, and an insulating layer between the fixed and movable micromechanical structures; and an integrated circuit having circuit elements being wired with the aid of at least one of the at least one conductive layer, which comprises:

producing the fixed micromechanical structure by structuring the at least one conductive layer, while simultaneously structuring the at least one conductive layer in the region of the integrated circuit; and exposing at least a portion of the interstice between the plates and the movable micromechanical structure by removal of the insulating layer in an etching process having adequate selectivity for the at least one conductive layer and the dielectric layer and having an isotropic component.

4. The production process according to claim 3, which comprises carrying out the etching process as a microwave-supported isotropic dry etching.

5. The production process according to claim 3, which comprises carrying out the etching process with a buffered HF solution.

6. The production process according to claim 3, which comprises producing the integrated circuit and the micromechanical component with a plurality of conductive layers, covering the conductive layers with further insulating layers, and etching the insulating layers in the etching process with adequate selectivity for the conductive layers.

* * * * *